(12) United States Patent
Claes et al.

(10) Patent No.: US 8,592,998 B2
(45) Date of Patent: Nov. 26, 2013

(54) THIN FILM WAFER LEVEL PACKAGE (75) Inventors: Gert Claes, Kessel-Lo (BE); Ann Witvrouw, Herent (BE)

(73) Assignees: IMEC, Leuven (BE); Katholieke Universiteit Leuven, KU LEUVEN R&D, Leuven (BE)

( * ) Notice: Subject to any disclaimer, the term of this patent is extended or adjusted under 35 U.S.C. 154(b) by 0 days.

(21) Appl. No.: 13/012,275

(22) Filed: Jan. 24, 2011

(65) Prior Publication Data

US 2011/0180943 A1 Jul. 28, 2011

Related U.S. Application Data (60) Provisional application No. 61/297,386, filed on Jan. 22, 2010.

(51) Int. Cl.
*H01L 23/28* (2006.01)

(52) U.S. Cl.
USPC .................... 257/787; 257/415; 257/E23.116

(58) Field of Classification Search
USPC .......... 257/622, 787–796, E23.116, E21.502, 257/415, 416; 438/127, 125, 121
See application file for complete search history.

(56) References Cited

U.S. PATENT DOCUMENTS

| 5,834,333 A * | 11/1998 | Seefeldt et al. ................. 438/52 |
| 2003/0102552 A1 | 6/2003 | Martin et al. |
| 2008/0079142 A1 | 4/2008 | Carmona et al. |
| 2008/0135998 A1 * | 6/2008 | Witvrouw et al. ............ 257/678 |

OTHER PUBLICATIONS

Yu-Qun Hu et al., "Tensile Tests of Micro Anchors Anodically Bonded Between Pyrex Glass and Aluminum Thin Film Coated on Silicon Wafer," Microelectronics Reliability 48, (2008) 1720-1723; journal homepage: www.elsevier.com/locate/microrel.
Zbigniew Olszewski et al., "Characterization, Modelling and Performance Evaluation of CMOS Integrated Multielectrode Tunable Capacitor (MTC)," Journal of Micromechanics and Microengineering, 15 (2005) S122-S131.
Article: SiGe MEMS Technology; IMEC Scientific Report, 2008.

* cited by examiner

*Primary Examiner* — Tucker Wright
(74) *Attorney, Agent, or Firm* — McDonnell Boehnen Hulbert & Berghoff LLP (57) ABSTRACT

Anchor designs for thin film packages are disclosed that, in a preferred embodiment are a combination of SiGe-filled trenches and Si-oxide-filled spacing. Depending on the release process, additional manufacturing process steps are performed in order to obtain a desired mechanical strength. For aggressive release processes, additional soft sputter etch and a Ti—TiN interlayer in the anchor region may be added. The ratio of the total SiGe—SiGe anchor area to the $SiO_2$—SiGe anchor area determines the mechanical strength of the anchor. If this ratio is larger than 1, the thin film package reaches the MIL-standard requirements.

8 Claims, 8 Drawing Sheets

THIN FILM WAFER LEVEL PACKAGE

CROSS-REFERENCE TO RELATED APPLICATIONS

The present application claims priority to U.S. Provisional Patent Application Ser. No. 61/297,386, filed in the United States Patent and Trademark Office on Jan. 22, 2010, the entire contents of which is incorporated herein by reference.

BACKGROUND

1. Field of the Invention

The present disclosure is related to thin film wafer level package and a method for forming such thin film wafer level package.

2. Description of the Related Art

With the increasing success of Micro Electro Mechanical Systems (MEMS) devices in the last decade comes a need for packaging technologies to encapsulate the MEMS device in a package. These packages serve to protect the often fragile MEMS device from, e.g., the processing environment during dicing and assembly of the substrate on which the MEMS device is formed. Furthermore these packages assist in providing an improved operation of the MEMS device and a sufficient lifetime thereof.

Several options exist to process the package on top of the MEMS device. There are the wafer-to-wafer approach, the chip-to-wafer approach and the use of a thin film encapsulation process. The first two approaches are expensive as they require processing of two different substrates while resulting in a packaged MEMS device having a large area and volume. The use of a thin film encapsulation process, often referred to as zero-level (0-level) packaging, to form a package over the MEMS device is more elegant, as it is a batch process. Moreover this approach results in a compact solution. Using poly-SiGe both as a structural material for the MEMS device and as the thin film packaging layer further enables the integration of a packaged MEMS device on a CMOS substrate thanks to the low deposition temperature of the poly-SiGe (<450° C.)

To ensure a robust 0-level package, which survives subsequent processing such as dicing, wirebonding, and the 1-level plastic molding packaging process, the shear strength of the package becomes very important.

SUMMARY

The disclosure is related to thin film packages, i.e. 0-level packages, having different anchor design parameters, processing parameters, and using different release processes. Preferably SiGe is used to form the thin film package.

The disclosure is also related to a thin film package, method, and microelectronic device as disclosed in the appended claims.

In a first aspect, the disclosure is related to a thin film wafer level package comprising a substrate, a membrane, and an anchor frame configured to support the membrane and to connect the membrane to the substrate, the anchor frame having an inner wall and an outer wall, thereby forming within the inner wall a chamber between the substrate and the membrane, wherein the anchor frame comprises at least one cavity or at least one group of cavities between the inner and outer walls, the cavity or group of cavities encircling the chamber. Encircling means that either at least one cavity forms a closed loop around the chamber area, or a number of cavities are placed at a plurality of places all around the chamber area. The cavity or cavities may be hollow openings (i.e. not filled with solid material) or openings filled with a solid material different from the anchor frame material.

According to an embodiment, the anchor frame comprises at least two closed-loop walls, a cavity being formed by the spacing between two adjacent closed-loop walls. The closed-loop walls may be concentric, and may have the same width.

The cavity may be configured as a grid of, possibly interconnected, cavities.

The membrane and the anchor frame may be formed of the same material. In a preferred embodiment, this material is silicon-germanium.

According to an embodiment, the at least one cavity or group of cavities in the anchor frame is filled with a material different from the material of the anchor frame. The material may be silicon-oxide.

The disclosure is equally related to a microelectronic device comprising a thin film wafer level package that encapsulates a MEMS device contained in the chamber.

The disclosure is equally related to a method of forming a thin film wafer level package on a substrate, the method including:

forming a sacrificial layer over the substrate,
  forming in the sacrificial layer at least two closed-loop trenches spaced apart and formed through the complete thickness of the sacrificial layer, the at least two trenches including an inner trench and an outer trench, the inner trench defining a chamber area within the inner trench,
  forming a layer filling these at least two trenches thereby forming an anchor frame, so that the filled inner and outer trench form an inner and outer wall of the anchor frame,
  forming a layer overlying the filled trenches, the area between the filled trenches and the chamber area, thereby forming a membrane layer, and,
  removing the sacrificial layer at least from the chamber area thereby forming within the inner wall of the anchor frame, a chamber between the membrane and the substrate.

The method may further include forming a Ti—TiN interlayer over the sacrificial layer and on the filled trenches before forming the membrane layer. The method may further include a soft sputter etch step prior to the formation of a Ti—TiN interlayer.

According to an embodiment, forming at least two closed-loop trenches includes forming a plurality of trenches connecting these closed-loop trenches. According to an embodiment, forming at least two closed-loop trenches includes forming a plurality of trenches between and separate from these closed-loop trenches.

The filling layer and the overlying layer may be formed simultaneously.

DETAILED DESCRIPTION

The drawings described are only schematic and are non-limiting. In the drawings, the size of some of the elements may be exaggerated and not drawn to scale, for illustrative purposes. The dimensions and the relative dimensions do not necessarily correspond to actual reductions to practice of the disclosure.

Furthermore, the terms first, second, third, and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under, and the like in the description and the claims are used for descriptive purposes and not necessarily for describing relative positions. The terms so used are interchangeable under appropriate circumstances and the embodiments of the disclosure described herein can operate in other orientations than described or illustrated herein.

The term "comprising," used in the claims, should not be interpreted as being restricted to the means listed thereafter; it does not exclude other elements or steps. It needs to be interpreted as specifying the presence of the stated features, integers, steps, or components as referred to, but does not preclude the presence or addition of one or more other features, integers, steps, or components, or groups thereof. Thus, the scope of the expression "a device comprising components A and B" should not be limited to devices consisting only of components A and B. It means that with respect to the present disclosure, the only relevant components of the device are A and B.

In a first aspect a thin film wafer level package is disclosed including a membrane supported by and connected via an anchor frame to a substrate thereby forming a chamber, wherein the anchor frame comprises at least one cavity. These closed-loop walls can be concentric and preferably have substantially the same width.

The cavity between the closed-loop walls can be formed by the spacing between these closed-loop walls or can be configured as a grid of cavities, whereby the closed-loop walls are interconnected.

The membrane and the anchor frame can be formed of the same material. Preferably this material is silicon-germanium.

The cavity in the anchor frame can be filled, preferably with silicon-oxide.

In a second aspect a microelectronic device is disclosed including a thin film wafer level package according to the first aspect. This microelectronic device can further comprise a MEMS device contained in the chamber of the thin film wafer level package.

In a third aspect a method for forming a thin film wafer level package on a substrate is disclosed, the method comprises forming a sacrificial layer over the substrate, forming at least two closed-loop trenches through this sacrificial layer, forming a layer filling these closed-loop trenches thereby defining a cavity between each pair of closed-loop trenches, the cavity being filled with the material of the sacrificial layer, and forming a layer overlying the closed-loop trenches and the area between the closed-loop trenches. The step of forming at least two closed-loop trenches can further comprise forming at least one trench connecting these closed-loop trenches. The overlying layer will constitute the membrane of the thin film wafer level package while the filling material is part of the anchor frame thereof.

The filling layer and the overlying layer are formed simultaneously. Preferably silicon-germanium is used to form the filling and overlying layer. Preferably the material of the sacrificial layer is silicon oxide.

For the purpose of teaching, the thin film wafer packages in this disclosure were manufactured using SiGe as structural material to form the membrane overlying the chamber containing the MEMS device and the anchors supporting the membrane and connecting it to the substrate. Using SiGe to form the thin film wafer level package as well as the encapsulated MEMS device has advantages from an integration point of view. However the present disclosure is not limited to SiGe packages. Other materials can be used to form the thin film wafer level package and the materials used need not be the same as the materials used to form the MEMS device.

Figure 1:
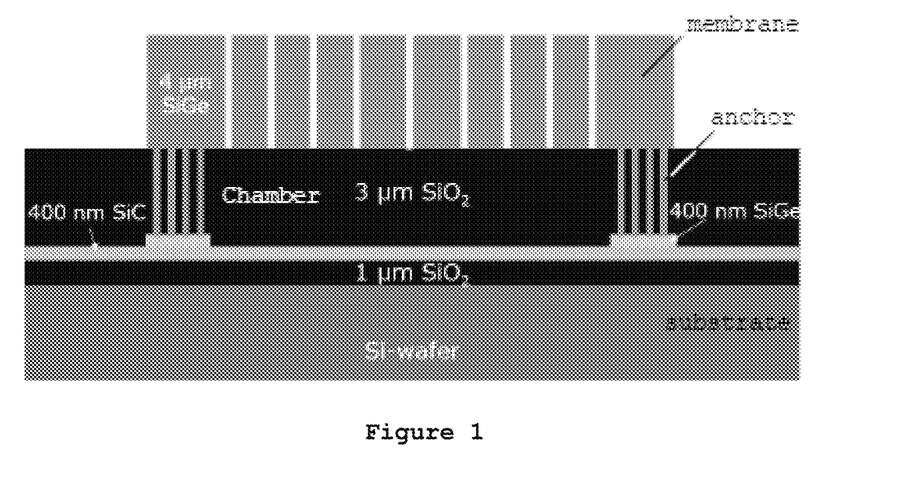
FIG. 1 shows a schematic cross-section of a thin film wafer level package, according to this disclosure, before release of the MEMS device within the package with release holes in the SiGe membrane overlying the sacrificial SiO2 layer surrounding the MEMS device.

FIG. 1 shows a schematic cross-section of a thin film wafer level package, according to this disclosure, before removal of the sacrificial layer within the chamber encapsulated by the thin film wafer level package. In the membrane overlying the sacrificial layer of the chamber release or etch holes 14 (see FIG. 17) are present to this purpose.

The thin film wafer level package of FIG. 1 was realized using SiGe, preferably poly-SiGe, as membrane layer. The test structure of FIG. 1 was formed on a semiconductor, e.g. Si, substrate. The test structure is configured as closed chamber, here a poly-SiGe bordered chamber, on top of a protective layer, here a 400 nm SiC layer (deposited as 4×100 nm). This SiC layer acts as a CMOS protection layer in case these CMOS-compatible packages are built on top of CMOS, i.e. on top of a substrate containing electronic circuitry typically formed using CMOS process technology. In normal operation, this chamber contains the MEMS device to be packaged.

On top of this protective layer, here SiC, a 400 nm thick SiGe layer is deposited and patterned to remain at the location of the anchors of the thin film package. When SiGe is used to form the MEMS device as well, this SiGe layer is also used to form the lower electrode layer of the MEMS device.

Then a sacrificial layer, here a 3 μm thick High Density Plasma (HDP) $SiO_2$, is deposited. In normal operation the MEMS device is embedded in this sacrificial layer. Closed-looped trenches are etched throughout this sacrificial layer thereby stopping on the underlying patterned poly-SiGe layer. These trenches encircle the area of the chamber, which in normal operation contains the MEMS device. Between each pair of trenches the material of the sacrificial layer remained thereby forming spacing between these trenches. The layout of these trenches is discussed in more detail in paragraphs below.

These trenches are filled during the deposition of the material of the membrane layer, here 4 μm thick poly-SiGe has been deposited. The filled trenches now define a cavity which is filled with the remaining material of the sacrificial layer. Only one value for trench width of small width, e.g. 1 μm, is used for all trenches to ensure a planarized membrane layer after deposition of the poly-SiGe membrane layer. The width of the trench is chosen to have minimal or no impact on the planarity of the subsequently formed membrane layer. Additional trenches can be formed to increase the overall area of the anchor frame, if needed. In prior art thin film wafer level packages, a single trench was patterned to form a homogeneous anchor, whereby the width of this trench was equal to the width of the anchor frame. Such a single wide trench has a negative impact on subsequent formation of the membrane requiring additional process to ensure that the surface of the membrane layer is planar. The filled trenches constitute the anchor frame of the thin film package sealing the sidewalls of the chamber while the membrane layer is provided to seal, after closure of the release openings, the upper part of the chamber.

Then, the membrane layer is patterned to define the thin film packages formed on the single substrate. During this patterning step there is also the definition of the etch holes that are needed to remove the sacrificial layer from the chamber inside the package.

Figure 2A:
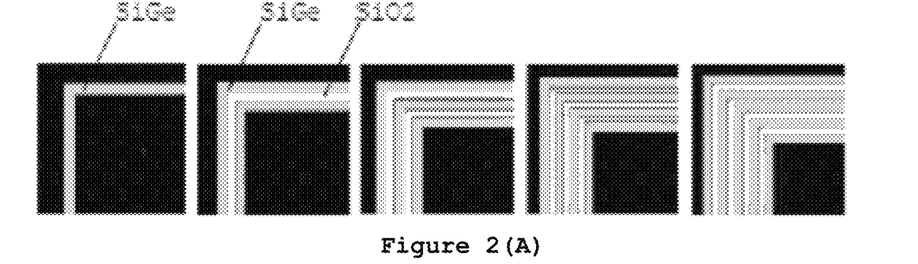
FIGS. 2(A) and 2(B) show examples of different anchor designs for the thin film wafer level package according to this disclosure: 2(A) the cavities in the SiGe frame are formed as continuous lines 2(B) the cavities in the SiGe frame are formed as grid of, optionally interconnected, cavities. The grey lines are the poly-SiGe walls of the SiGe frame, while the white color represents the cavities within this SiGe frame which are here filled with $SiO_2$.
Figure 2B:
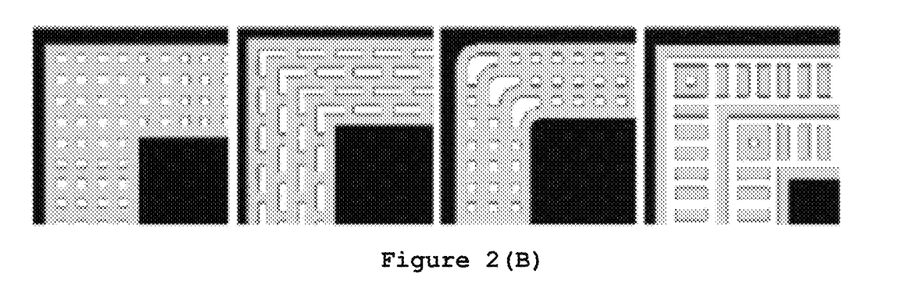

FIGS. 2(A) and 2(B) show examples of different anchor designs for a thin film wafer level package according to this disclosure: 2(A) the cavities in the anchor frame, here SiGe, are formed as continuous lines, 2(B) the cavities in the anchor frame, here SiGe, are formed as a grid of optionally interconnected cavities. The grey lines are the poly-SiGe walls of the SiGe frame, while the white color represents the cavities within this SiGe frame which are filled with the sacrificial material, here $SiO_2$. Anchor designs are thus a combination of at least two concentric trench rings, preferably of equal width, with and without connections and with different spacing.

During the release process, the sacrificial layer of the chamber is removed through etch or release holes in the membrane layer. In this disclosure both a wet buffered HF (BHF) and dry vapor HF (VHF) release process was used for 60 minutes. As no release holes were present above the anchor areas the sacrificial material, here Si-oxide, contained within the anchor frame is expected to remain there. The inner size of the packages was 100×100 μm². The anchor width varies from 1 to 20 μm.

Figure 3:
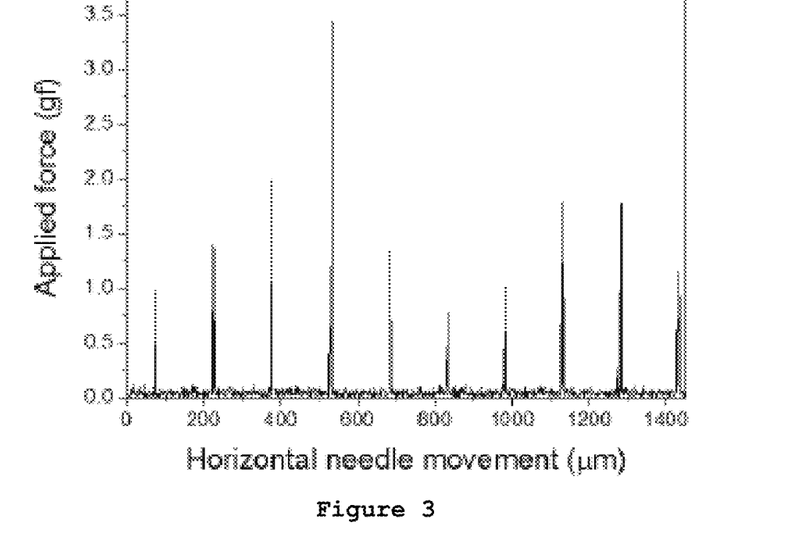
FIG. 3 shows a shear force test measurement performed on 10 different thin wafer film packages according to this disclosure. The peak height gives the required force to destroy the package.

Shear tests were done using a Condor 250 tool from XYZ-TEC. A 100 μm wide needle moves horizontally over the surface including the released packages. The test structures were placed in rows of 10. The tool registers the force needed to move the needle. An example of such a measurement is shown in FIG. 3. Every peak in this graph corresponds to a position where the needle touches a package. A higher peak corresponds to a stronger package. By applying a force on the thin film packages, they will eventually delaminate and the registered force can be seen as a value characteristic of the shear strength of the package and, in particular, of the anchor frame.

Figure 4:
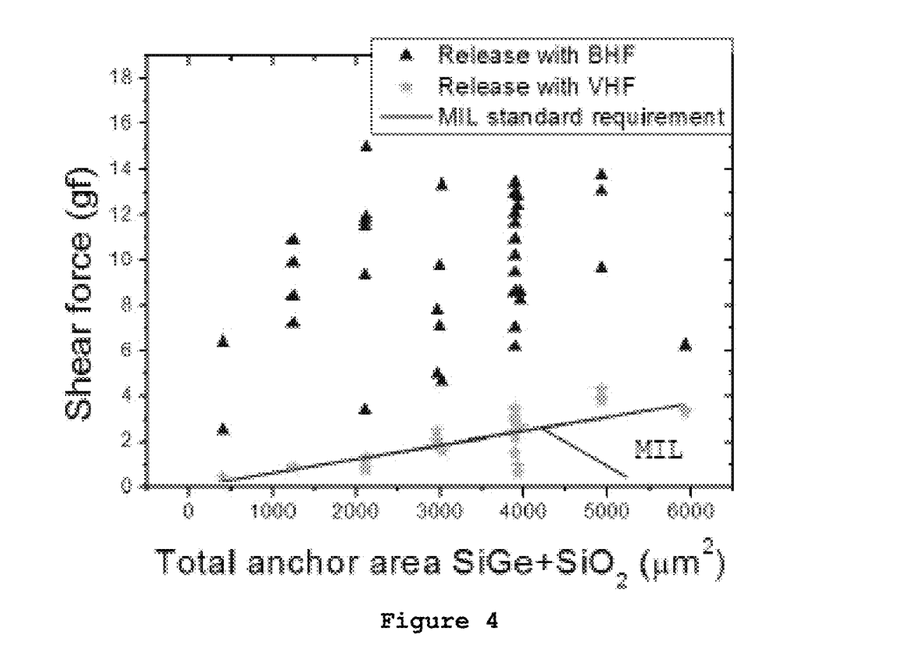
FIG. 4 shows the shear force values for different anchor designs, according to this disclosure, released using a wet (dark triangle) or dry (grey star) release process of the encapsulated MEMS device. Also the MIL-standard (1×) for shear force strength is plotted as a reference (sloped line).

FIG. 4 shows the shear force obtained for different anchor designs released with either BHF (dark triangle) or VHF (grey start) together with the minimum shear force specified by the MIL-STD 883E standard (method 2019.5). The BHF released samples all met the required standard, as the corresponding points are above the MIL reference line, while not all VHF samples reached this MIL spec. About 62.5% of the tested anchor designs reached the MIL spec.

Figure 5A:
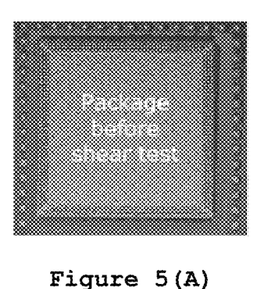
FIGS. 5(A)-(C) shows light microscope images of 5(A) package before shear test; 5(B) the package of 5(A) after BHF release of the MEMS device and after shear test showing delaminating of SiC in a ring area; 5(C) VHF released prior art package after shear test where the thin SiGe frame is still in place indicating SiGe—SiGe anchor delamination.
Figure 5B:
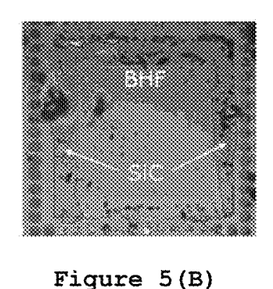
Figure 5C:
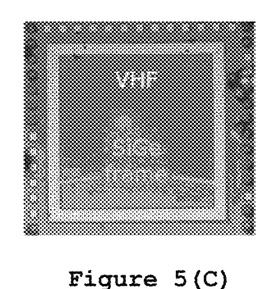

The failing mechanisms for both BHF and VHF released samples can be derived from the pictures shown in FIGS. 5(A) and 5(B). For the BHF released samples it can be seen in FIG. 5(B) that the underlying SiC protective layer delaminated during the release process. This means that the anchors themselves are even stronger than the value plotted in FIG. 4. For VHF released samples, delaminating occurred between the thin poly-SiGe frame and the 4 μm thick poly-SiGe membrane as the thin poly-SiGe frame is still visible in FIG. 5(C). Thus, after VHF release, the interface between the anchors and the membrane was the weakest interface and the results of these samples were therefore used to study the effect of the anchor design on the mechanical strength of the package.

Figure 6:
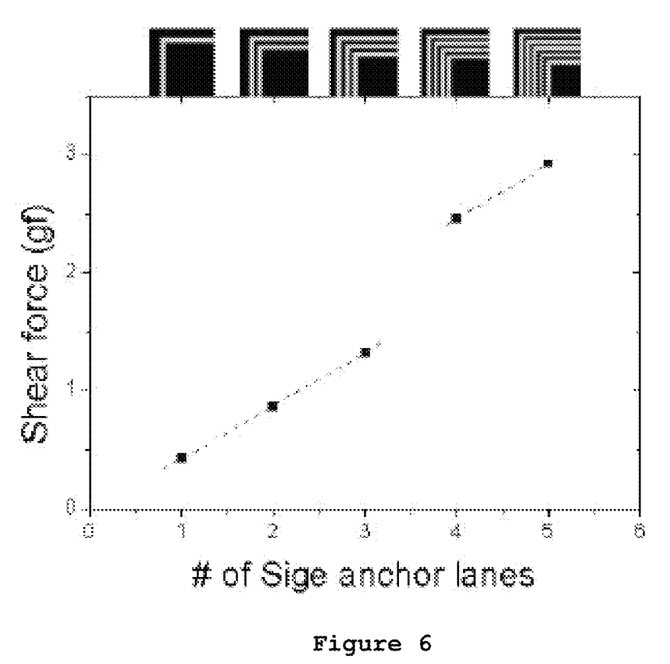
FIG. 6 shows shear force values for VHF released thin film wafer level packages according to FIG. 2(A), with varying number of anchor lanes in the SiGe frame. For each measurement point the corresponding anchor structure is shown on top of the figure.

FIG. 6 shows the shear force for VHF released samples with increasing anchor width, i.e. increasing number of SiGe anchor lanes as each anchor lane had the same width defined by the patterning of the trenches in the sacrificial layer. It can be seen that the shear force increases with number of anchor lines. There is a monotonous linear behavior between the samples having 1 to 3 SiGe anchor lanes. For samples having anchors with 4 or 5 lanes there is an upward shift of the shear force. The offset between anchor frame with different number of anchor lanes, here SiGe walls, can be explained by the attack of the $SiO_2$ incorporated in the anchor frame, as further discussed below.

Figure 7:
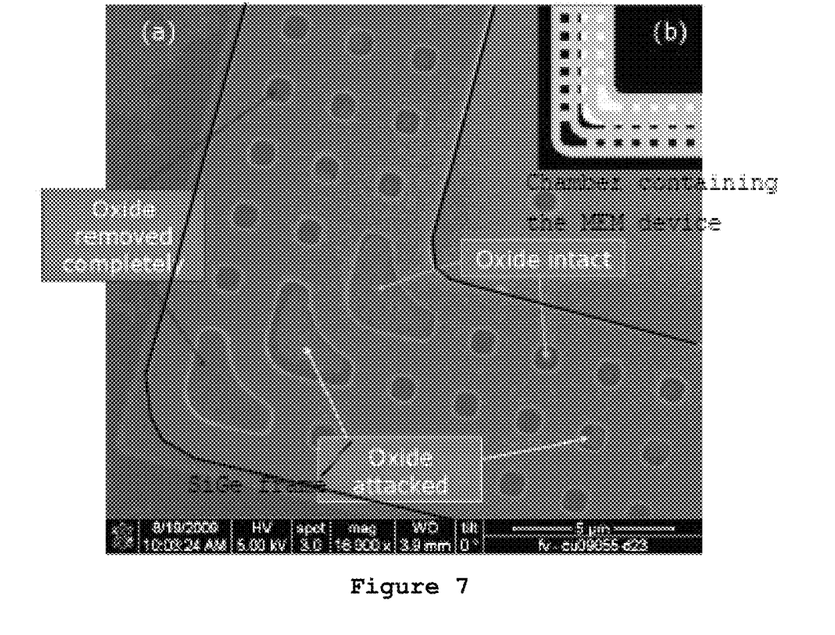
FIG. 7 shows two regions (a) and (b) of a scanning electron microscope (SEM) image of an anchor of a thin film wafer level package according to this disclosure, after 60' VHF release of the MEMS device. The anchor is configured as a grid of cavities within the anchor frame. It is clear from region (a) that the $SiO_2$ in the cavities has been removed in the outer anchor lane. The $SiO_2$ in the middle part has been attacked by the release fluid, while the inner part is still intact; region (b) shows a representation of the VHF attack of $SiO_2$ in the cavities of the anchor of region (a). In region (b), the oxide is shown in white while the SiGe anchor frame is shown in grey. In the outer part of the anchor the oxide is removed (dark color).

The VHF release process is very aggressive and can penetrate the anchor-membrane interface, here a SiGe—SiGe interface, after which the VHF attacks the sacrificial material, here $SiO_2$, contained in the cavities formed in the anchor frame. FIG. 7 shows two regions (a) and (b) of a scanning electron microscope (SEM) image of an anchor of a thin film wafer level package according to this disclosure, after 60' VHF release of the MEMS device. The anchor is configured as a grid of cavities within the anchor frame. It is clear from region (a) that the $SiO_2$ in the cavities has been removed in the outer anchor lane. The $SiO_2$ in the middle part has been attacked by the release fluid, while the inner part is still intact; region (b) shows a representation of the VHF attack of $SiO_2$ in the cavities of the anchor of region (a). In region (b), the oxide is shown in white while the SiGe anchor frame is shown in grey. In the outer part of the anchor the oxide is removed (dark color).

As the material from the cavities in the anchor frame is removed, the contact area between the anchor and the substrate is reduced and therefore the force needed to destroy the package is also reduced. In this example, for up to 3 lanes, substantially all $SiO_2$ is assumed to be gone in the anchor region, while some $SiO_2$ is probably remaining for anchors with more lanes. The extent to which the cavity filing material is removed from the anchor frame during the release process will depend on the material used to form the anchor frame, the dimensions of the frame (in particular the width of the anchor lanes defined by the trenches etched in the sacrificial material), the sacrificial material used, and the release process itself.

Based on the results from FIG. 6, it is expected that, if this penetration process is avoided, the VHF released samples would be (similar to the BHF released samples) very robust. Therefore new test samples with an improved process flow were made.

New samples were prepared with the use of an Ar soft sputter etch (SSE) and the deposition of a Ti—TiN (5-nm) interlayer on the sacrificial layer before the deposition of the membrane layer, here poly-SiGe. The soft sputter etch removed the native oxide present on exposed surfaces of the thin poly-SiGe anchor frame. Also the Ti—TiN interlayer helped in reducing the impact of the remaining native oxides. These native oxides can form a path for the VHF release fluid to attack the $SiO_2$ inside the anchors. Removal of the native oxides enhanced the VHF compatibility of the anchors. In addition, a Ti—TiN interlayer improved the adhesion between the thin SiGe anchor frame and the SiGe membrane layer.

Figure 8:
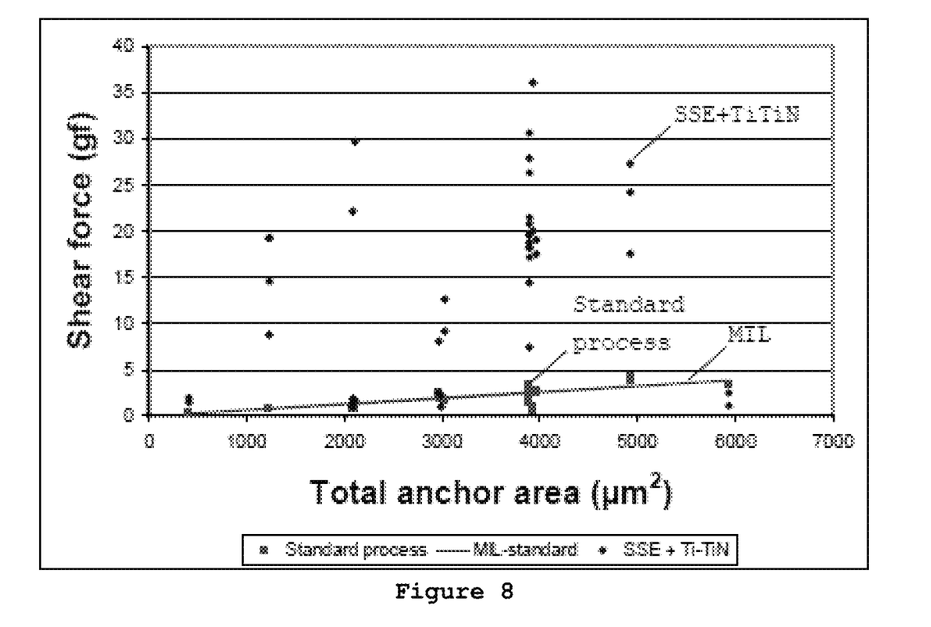
FIG. 8 shows shear force results from thin film wafer level packages, according to this disclosure, with 20 nm soft sputter etch (SSE) and Ti—TiN interlayer (diamond) compared to results from the standard process (square) and the MIL-standard (sloped line). Samples were released using a 60' VHF release process. The indicated thickness removed during the Ar SSE step, is equivalent to the thickness removed with this process for $SiO_2$ on blanket wafers.

FIG. 8 shows the shear force required for the different anchor designs after a 60' VHF release process on test samples prepared with the manufacturing process without (standard: grey square) and with (SSE+Ti_TiN: dark diamond) a soft sputter etch, here with 20 nm SSE, and an interlayer, here a Ti—TiN interlayer. Also the MIL-standard is shown as reference. As can be seen in FIG. 8, for most anchor designs the anchor strength is largely improved when using the manufacturing process with soft sputter etch and interface layer. About 85% of all anchor designs now met the MIL specification.

FIGS. 9(A)-(D) show anchor designs of samples with SSE and Ti—TiN interlayer that did not meet the MIL-standard. The $SiO_2$ to SiGe membrane contact area was larger for these anchor layouts than the SiGe to SiGe membrane contact area. This indicates that for samples with a Ti—TiN interlayer the anchor strength is mainly coming from the SiGe to SiGe interface.

Figure 9A:
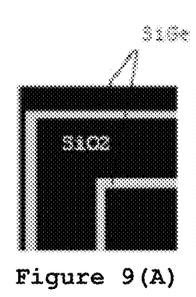
FIGS. 9(A)-(D) show anchor designs, according to this disclosure, that do not meet the MIL-standard specifications. The anchor is configured as an array of concentric SiGe polygons whereby the space between the different polygons is filled with SiO2. These anchor designs correspond to the dots on FIG. 8 falling below the sloped line (MIL) indicative of the MIL reference.
Figure 9B:
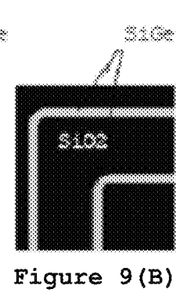
Figure 9C:
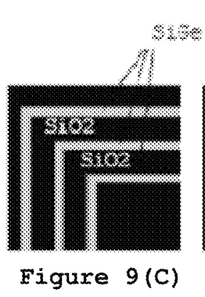
Figure 9D:
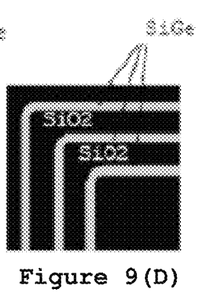
Figure 10:
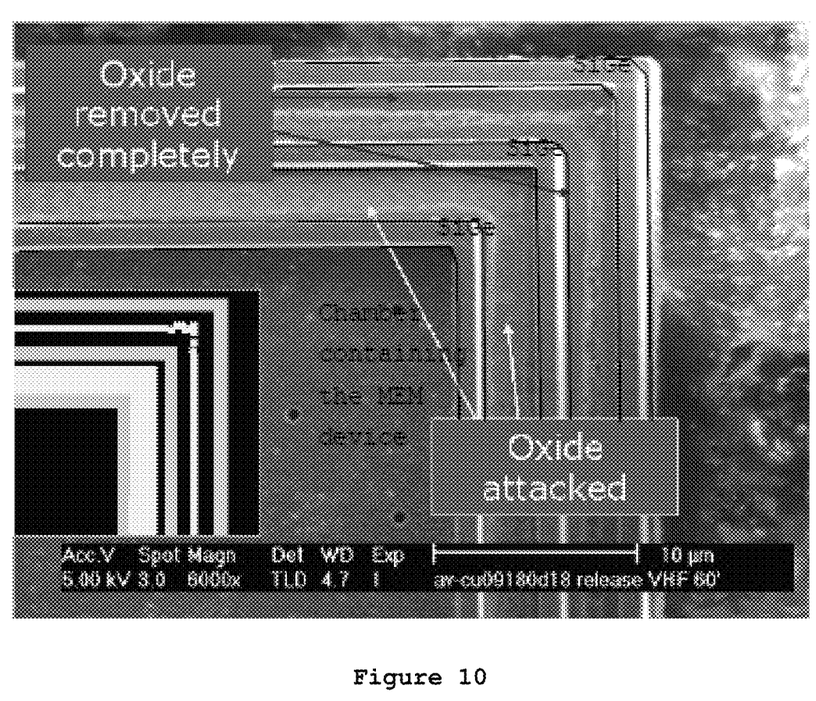
FIG. 10 shows a SEM picture of the anchor of FIG. 9(C). It can be seen that the VHF released fluid has attacked the $SiO_2$ inside the anchor.

A more profound inspection was done on the anchor design of FIG. 9(C). Unexpectedly, as can be seen in FIG. 10, the VHF release fluid did still penetrate through the SiGe—SiGe anchor interface and was able to attack the $SiO_2$ inside the anchor frame. The release of the oxide within the anchor frame reduced the total anchor contact interface and hence the overall mechanical strength of the anchor. Possibly not all interfacial oxide was gone in the sample studied thereby causing the unwanted oxide release within the cavity. A SSE for a longer time might be needed to completely prevent the VHF release fluid from attacking the cavity filling material.

However, although the VHF release fluid still attacked the $SiO_2$ contained in the anchor, each anchor design for which the ratio [SiGe—SiGe anchor area/$SiO_2$—SiGe anchor area] was larger than 1 reached the MIL-standard. By determining this ratio in thin film packaging anchor designs, the anchor is less prone to the release process and will have a higher shear force. This increased mechanical strength is believed to be a consequence of the improved adhesion between the two SiGe layers, i.e. anchor frame and membrane layer, in the anchor region.

Figure 11:
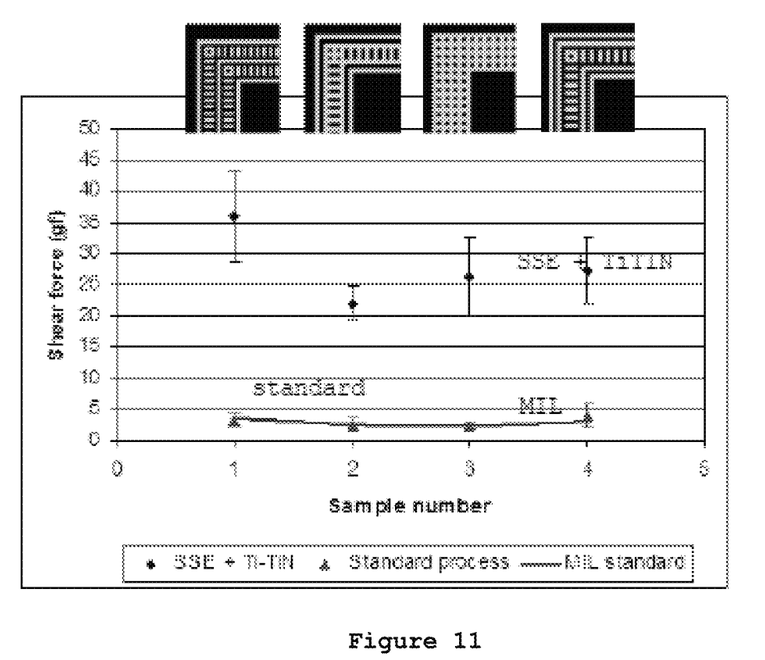
FIG. 11 shows the shear force of strongest anchor designs, i.e., where the cavities are arranged as a grid, according to this disclosure, after 60'VHF release (diamond) and a comparison with standard (triangle) release process. The MIL reference line (MIL) is also added. For each measurement point the corresponding anchor structure is shown on top of the figure.

FIG. 11 depicts the strongest anchor designs for samples manufactured with and without the SSE and Ti—TiN interlayer. From all tested anchor design, these designs had the largest SiGe—SiGe anchor area in line with the conclusion drawn above. This increased contact area was obtained by laying out the anchor frame as a grid of SiGe walls, whereby the gaps between these walls are filled with oxide.

Figure 12:
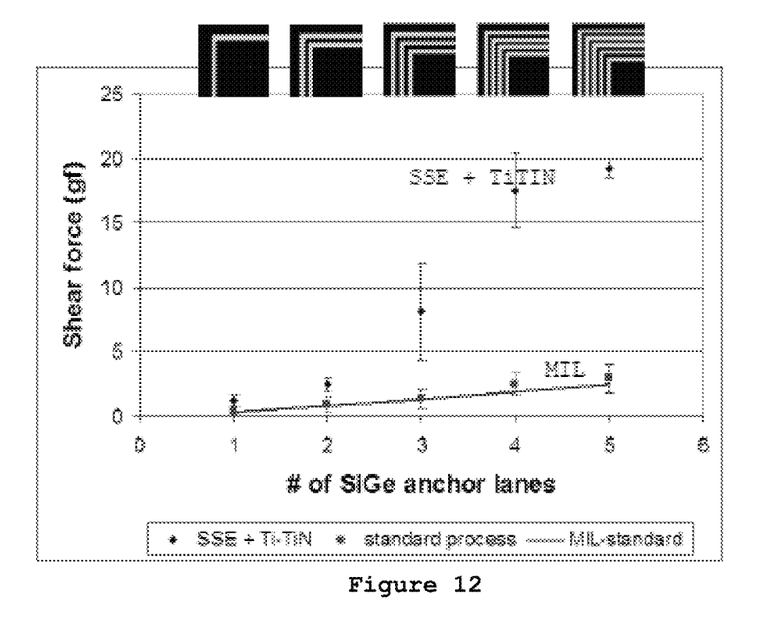
FIG. 12 shows the shear force results for different anchor designs, according to this disclosure, with varying number of anchor lanes for SSE samples released with VHF (diamond) and for samples released with BHF (square). The MIL reference line (MIL) is also added. For each measurement point the corresponding anchor structure is shown on top of the figure.

FIG. 12 shows the shear force results for different anchor designs, according to this disclosure, with varying number of anchor lanes for SSE samples released with VHF (diamond) and for samples released with BHF (square). The MIL reference line (MIL) is also added. For each measurement point the corresponding anchor structure is shown on top of the figure.

From FIG. 12 it can be seen that the shear test value for the anchor design consisting of only one poly-SiGe anchor lane (left design in FIG. 2a) is above the MIL specification. As the values for these samples were above the MIL-standard requirements one can conclude that this type of anchor is strong enough to be used for thin film packaging applications. Hence for a thin film package covering 100×100 $\mu m^2$ only an anchor area of 404 $\mu m^2$ might be needed. Such a single lane anchor design will significantly reduce the total occupied area of the thin film packages and can lead to further cost reduction of thin film packaging processes.

Figure 13:
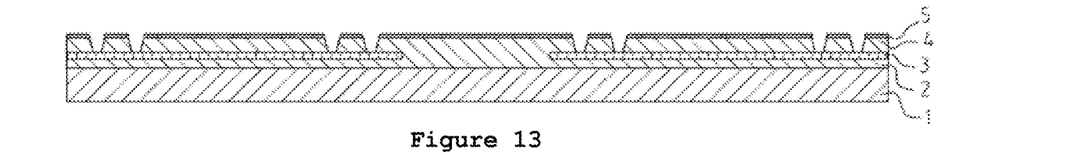
FIGS. 13 to 18 illustrate schematic cross sections of a process flow according to this disclosure.

FIGS. 13 to 18 schematically illustrate a process flow for manufacturing packaged MEMS devices according to this disclosure. FIG. 13 shows a substrate 1, for instance a silicon wafer. On top of a main surface of the silicon wafer, a silicon oxide ($SiO_2$) layer 2 with a thickness of e.g. 300 nm, is deposited. A patterned conductive layer including different sub layers 3 is formed on top of the layer 2. The sub layers can comprise for instance a Ti/AlCu/Ti/TiN stack with a thickness of for instance 20 nm/590 nm/20 nm/45 nm. If the substrate 1 is a CMOS substrate, the metal layer 3 can be the top metal layer of an interconnect scheme of this semiconductor substrate including active components such as circuits. The MEMS device is then processed on top of electronic circuitry formed on this substrate.

Overlying the patterned metal layer 3 a silicon oxide (SiO$_2$) layer 4 of about 1500 nm thickness is deposited. A 300 to 400 nm SiC protection layer 5 is deposited on the oxide layer 4. Openings in layers 5 and 4 are present to form contact holes to the metal layer 3. Via the contact holes an electrical connection can be formed between on the one hand a MEMS device in the cavity and on the other hand the bond pad adjacent to the cavity.

Figure 14:
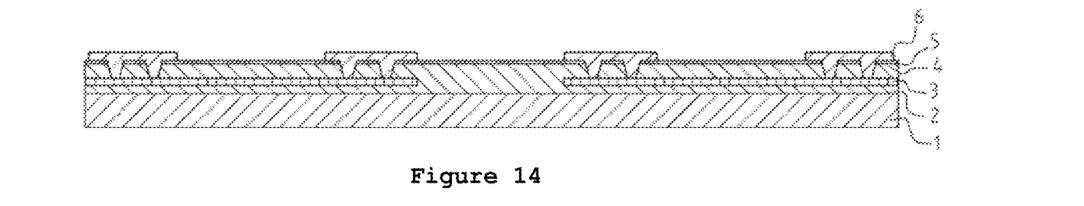

Then a silicon germanium electrode layer 6 is deposited by means of chemical vapour deposition (CVD), for instance having a thickness of 400 nm, and being connected to the top CMOS electrode layer 3. The silicon germanium layer 6 is patterned into silicon germanium electrodes as shown in FIG. 14. This patterned SiGe layer 6 also contains the area where the anchor frame is to be formed.

Figure 15:
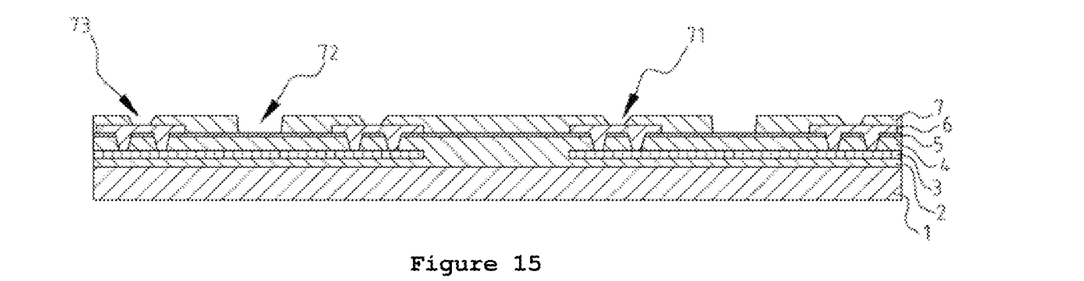

Another sacrificial silicon oxide (SiO$_2$) layer 7 (thickness typically of about 1 to 3 µm) is deposited. The sacrificial layer is planarized by applying a chemical mechanical polishing step, reducing the surface topography for the further lithography steps. A further contact etch is performed by opening the sacrificial oxide 7 to define packaging anchors 72, MEMS feed-throughs 73 and the contact 71 to the MEMS device as shown in FIG. 15.

Figure 16:
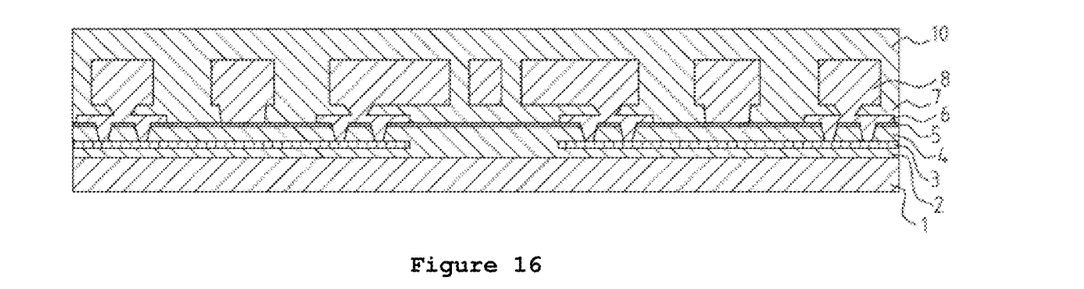

Now, the structural silicon germanium layer 8 is deposited typically with a thickness of 1 to 8 µm, optionally together with a 100 nm SiC layer (not depicted). The structural layer is used to form the MEMS device and the anchor of the thin film packages. Then the structural silicon germanium layer (and optionally the SiC layer) is patterned to form the MEMS device 84 (See FIG. 18), part of the packaging anchors and part of the electrical connection between the buried metal layer 3 and the bond pad. The patterning of the packaging anchors is done according to the layout considerations above. In the process flow illustrated by FIGS. 13 to 18 the anchor is shown as a single SiGe anchor lane. Then, the structure is covered by depositing a sacrificial silicon oxide layer 10 filling the gaps within the structural layer including the spacing between the SiGe anchor walls as shown in FIG. 16.

Figure 17:
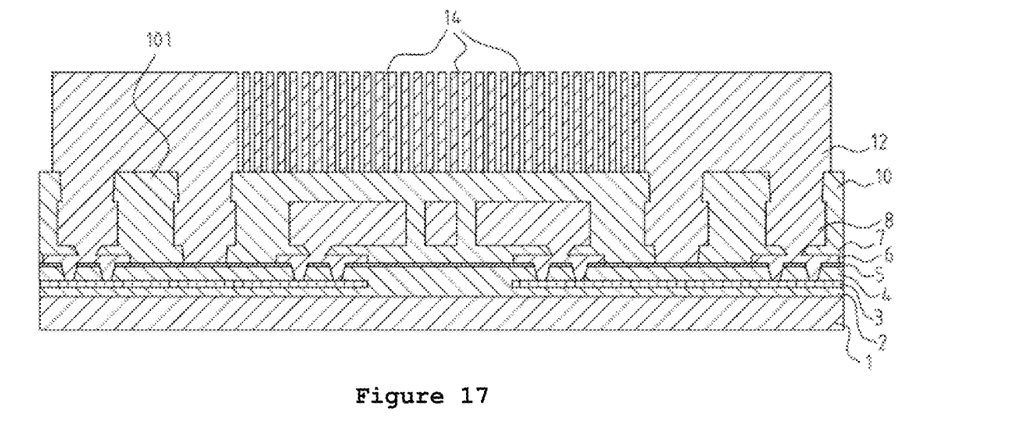

Now, the membrane contact etch is performed in the oxide layer 10, to form the anchors of the capping layer and part of the electric connection to the bond pad. The patterning of the oxide layer 10 with respect to the anchors is done according to the layout considerations above. Note that remaining portions 101 of the sacrificial layer are present, which can support the electrical connection and the package sidewall or cavity sidewall. The remaining portion has a substantially flat upper surface. Then the polycrystalline silicon germanium membrane 12 deposition is performed (typically having a thickness of 4-10 µm), to obtain substantially flat silicon germanium membrane. Note that the level of the substantially flat upper surface of the remaining portion of sacrificial material 101 corresponds to the level of the lower surface the membrane layer 12. Then etch hole definition is performed to define the release holes 14 which will be used for removing the sacrificial material 10 under the membrane layer 12 as shown in FIG. 17. As explained above these release holes can not be formed within the anchor area.

Figure 18:
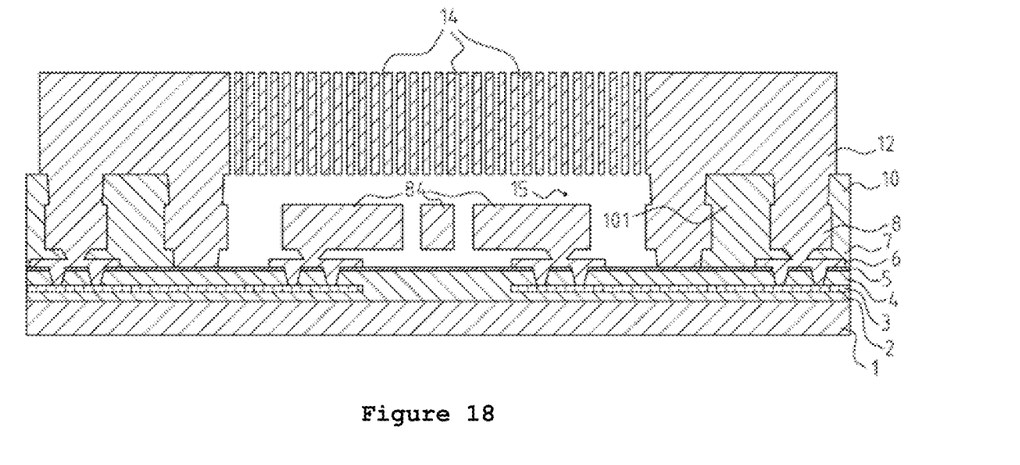

Now the release of the membrane layer and of the functional silicon germanium layer within the formed cavity can be performed by using an etching agent, for instance HF in the gas phase, which is passed through the openings or release holes 14 in the membrane layer 12, in order to remove the material of the sacrificial layers 10, 7, thereby creating cavity (chamber) or gap 15 below the membrane layer 12, the cavity including the MEMS device as shown in FIG. 18.

Further processing of the packaged MEMS device can be done using known manufacturing techniques to provide e.g. sealing of the release holes 14, forming the electrical connection to the MEMS bonding pads, and dicing of the individual packaged MEMS devices.

The invention claimed is:

1. A thin film wafer level package comprising:
   a substrate;
   a membrane;
   an anchor frame configured to support the membrane and to connect the membrane to the substrate; and
   a chamber area formed between the substrate, the membrane, and the anchor frame,
   wherein the anchor frame comprises an inner wall and an outer wall relative to the chamber area, wherein the anchor frame comprises one of a cavity and a group of cavities between the inner wall and the outer wall, the one of the cavity and group of cavities encircling a chamber formed in the chamber area,
   wherein the chamber area comprises a sidewall, and wherein the inner wall of the anchor frame defines the sidewall of the chamber area,
   wherein the membrane comprises a first section located above the anchor frame and a second section located above the chamber area, and wherein the membrane comprises release holes in the second section but not in the first section.

2. The thin film package of claim 1, the cavity being configured as a grid of cavities.

3. The thin film package of claim 1, wherein the membrane and the anchor frame are formed of a same material.

4. The thin film package of claim 3, wherein the material is silicon-germanium.

5. The thin film package of claim 1, wherein the one of the cavity and group of cavities in the anchor frame is filled with a material different from the material of the anchor frame.

6. The thin film package of claim 5, wherein the material different from the anchor frame material is silicon-oxide.

7. The thin film wafer level package of claim 1, wherein a height of the anchor frame is substantially the same as a height of the chamber.

8. The thin film wafer level package of claim 7, wherein the height of the anchor frame is substantially constant across the width of the anchor frame, and wherein the height of the chamber area is substantially constant across the width of the chamber area.

* * * * *